United States Patent [19]

Novosel

[11] Patent Number: 4,471,240

[45] Date of Patent: Sep. 11, 1984

[54] POWER-SAVING DECODER FOR MEMORIES

[75] Inventor: David Novosel, Pflugerville, Tex.

[73] Assignee: Motorola, Inc., Schaumburg, Ill.

[21] Appl. No.: 409,464

[22] Filed: Aug. 19, 1982

[51] Int. Cl.³ .................. H03K 19/094; H03K 19/20
[52] U.S. Cl. .................................... 307/463; 307/264; 307/449; 307/481; 307/482
[58] Field of Search ............... 307/443, 449, 453, 463, 307/481, 482, 573, 574, 581, 264; 365/227

[56] References Cited

U.S. PATENT DOCUMENTS

| | | | |
|---|---|---|---|
| 3,825,888 | 7/1974 | Kawagoe | 307/449 |
| 3,959,781 | 5/1976 | Mehta et al. | 307/449 |
| 4,048,629 | 9/1977 | Bormann | 307/449 |
| 4,185,320 | 1/1980 | Takemae et al. | 307/463 |
| 4,262,828 | 4/1981 | Perlegos et al. | 307/463 |
| 4,275,312 | 6/1981 | Saitou et al. | 307/449 |

OTHER PUBLICATIONS

Hsich et al., "MOSFET Storage Array Addressing System", *IBM Tech. Disc. Bull.*, vol. 13, No. 8, Jan. 1971, pp. 2383-2384.

*Primary Examiner*—Stanley D. Miller
*Assistant Examiner*—David R. Hudspeth
*Attorney, Agent, or Firm*—James L. Clingan, Jr.

[57] ABSTRACT

A decoder for memories improves speed and reduces power consumption by gating the power to a parallel decoder to provide a signal to a bootstrap circuit for providing an enable signal at essentially the voltage present at a positive power supply terminal.

5 Claims, 2 Drawing Figures

POWER-SAVING DECODER FOR MEMORIES

This invention relates to decoders for memories, and more particularly to MOS decoders using bootstrap techniques in the absence of zero threshold devices.

BACKGROUND OF THE INVENTION

A decoder, particularly row decoders, need to be able to provide an enabling signal of high current at the power supply voltage because of the capacitance of the relatively long line it must enable. One technique is to use a zero threshold transistor as a drive device. When a word line is to be selected, a zero threshold transistor is enabled by a signal at the amplitude of power supply voltage. Because of the near zero threshold voltage of a zero threshold transistor, the enabled transistor can provide an output at the amplitude of the power supply voltage. Such a technique is described in U.S. Pat. No. 4,264,828, Perlegos, et al.

Zero threshold transistors are not always available, however, due to the desire to minimize process complexity. For N-channel technology one technique is for all of the transistors to be doped to zero threshold and masking the transistors which are to be zero threshold voltage from the subsequent doping steps for the depletion and enhancement transistors. In the absence of zero threshold transistors, the initial doping of all the transistors can be for enhancement transistors so that only one subsequent doping step is required to obtain depletion transistors. The process for obtaining just enhancement and depletion transistors is simpler resulting in less expense and higher yields.

With the constraint that zero threshold transistors are not available, generating a signal at the amplitude of the power supply voltage for enabling a word line is more complicated. For dynamic random access memories (DRAMs) a technique for precharging a decoder prior to selection has been used. Such a technique is described in U.S. Pat. No. 4,087,044, Hofmann. This is useful in DRAMs when there is enough time prior to selection to precharge but not too much time so as to lose charge through leakage.

In static random access memories (SRAMs) and some other memories there is not an opportunity to precharge. For SRAMs, methods of bootstrapping have been developed. The problem with bootstrap techniques is that they normally use more power, particularly in the deselected decoders. For example, a memory may have 128 word lines each having a row decoder. When a word line is selected, 127 word lines are deselected. Consequently, the most power is likely to be lost in the deselected decoders. But since any one of the deselected decoders may be selected next, each deselected decoder must be ready to switch to the selected state. This state of readiness on the part of the deselected decoders normally causes a waste of power.

SUMMARY OF THE INVENTION

An object of this invention is to provide an improved decoder for memories.

Another object of the invention is to reduce power consumption in a decoder which is manufactured by a process which excludes the availability of zero threshold transistors.

Yet another object is to reduce power consumption of a row decoder which uses a bootstrap circuit.

These and other objects of this invention are achieved by a decoder for memories for providing an enable signal in response to an address. A selection means is coupled between a select node and a first power supply terminal for coupling the select node to the first power supply terminal when deselected by an address signal and for providing an open circuit therebetween when selected by the address signal. An enhancement transistor provides a voltage at the select node in response to a select signal and to the selection means being selected. Bootstrap means is coupled between a second power supply terminal and an output node. The bootstrap means provides the enable signal in response to the voltage at the select node by coupling the second power supply terminal to the output node with a negligible voltage drop therebetween.

DESCRIPTION OF A PREFERRED EMBODIMENT

Figure 1:
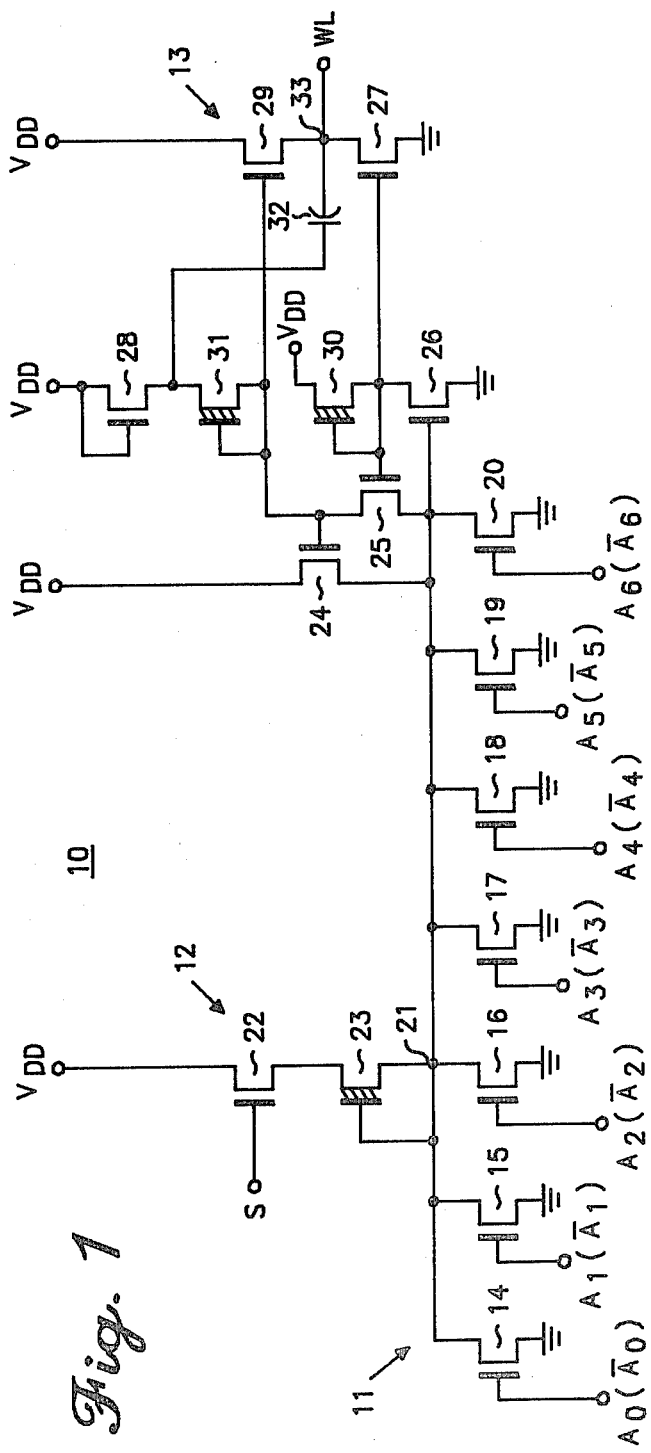
FIG. 1 is a schematic diagram of a decoder circuit according to a preferred embodiment of the invention.

Shown in FIG. 1 is a decoder circuit 10 comprised generally of a decode portion 11, a gating circuit 12, and a bootstrap circuit 13. Insulated gate field effect transistors of only two types are used, enhancement and depletion, both are n-channel. The enhancement transistors have a threshold voltage between 0.65 and 0.95 volt, whereas the depletion transistors have a threshold voltage between −3.1 and −3.9 volts. Decode portion 11 is comprised of seven enhancement transistors 14, 15, 16, 17, 18, 19 and 20, each having a drain connected to a select node 21, and a source connected to ground. Transistors 14–20 each have a gate connected to receive address signals $A_o$ ($\bar{A}_o$), $A_1$ ($\bar{A}_1$), $A_2$ ($\bar{A}_2$), $A_3$ ($\bar{A}_3$), $A_4$ ($\bar{A}_4$), $A_5$ ($\bar{A}_5$), and $A_6$ ($\bar{A}_6$), respectively. Gating circuit 12 is comprised of an enhancement transistor 22 and a depletion transistor 23. Transistor 22 has a drain connected to a positive power supply $V_{DD}$ which can be, for example, five volts, a gate for receiving a select signal S, and a source. Transistor 23 has a drain connected to the source of transistor 22, and a gate and a source connected to node 21.

Bootstrap circuit 13 is comprised of enhancement transistors 24, 25, 26, 27, 28 and 29, depletion transistors 30 and 31, and a capacitor 32. Transistor 24 has a drain connected to $V_{DD}$, a source connected to node 21, and a gate. Transistor 25 has a drain connected to the gate of transistor 24, a source connected to terminal 21, and a gate. Transistor 26 has a drain connected to the gate of transistor 25, a source connected to ground, and a gate connected to node 21. Transistor 27 has a gate connected to the drain of transistor 26, a source connected to ground, and a drain connected to a node 33. Transistor 28 has a gate and a drain connected to $V_{DD}$, and a source. Transistor 29 has a drain connected to $V_{DD}$, a source connected to node 33, and a gate connected to the drain of transistor 25. Transistor 30 has a drain connected to $V_{DD}$, and a gate and a source connected to the drain of transistor 26. Transistor 31 has a drain connected to the source of transistor 28, and a gate and a source connected to the gate of transistor 29. Capacitor 32 has a first terminal connected to the drain of transistor 31, and a second terminal connected to node 33.

Decoder circuit 10 is selected only when all of transistors 14–20 are off. If any one of transistors 14–20 is on, node 21 will be held to essentially ground which is a deselected mode of decoder 10. For 7 row address bits, as in this case, there can be 128 uniquely addressable rows, each having a decoder like decoder circuit 10, with only one selected at a time. Decoder circuit 10, although described in the context of a row decoder enabling a word line, could also be used for other decoding purposes, such as for a column decoder. In the selected state, with transistors 14–20 all off, decode portion 11 provides an open circuit between ground and node 21.

When decoder 10 is switched to a selected state, a signal $W_L$ is then provided at node 33 having an amplitude of essentially $V_{DD}$ in order to enable a word line. The process of providing signal $W_L$ at the amplitude of $V_{DD}$ is begun by an address change which also causes select signal S to be generated. Select signal S can be generated by any conventional address transition detection means one of which is shown in U.S. Pat. No. 4,099,265, Abe, which is hereby incorporated by reference. With address signals $A_o (\overline{A_o})-A_6 (\overline{A_6})$ changing to a combination which causes decoding portion 11 to provide an open circuit between node 21 and ground, select signal S causes transistor 22 to turn on which raises node 21 to a higher voltage. Transistor 23 is for current limiting purposes so that transistor 22 can be made to have a high gain. Transistors 22 and 23 cooperate to charge node 21 at a relatively constant rate with changes in $V_{DD}$. As node 21 rises in voltage, transistor 26 turns on which causes transistors 25 and 27 to turn off. Transistor 25 turning off causes transistor 24 to turn on, thereby keeping node 21 charged. After transistor 24 is turned on, select signal S can be removed because transistor 22 no longer needs to be on to keep node 21 charged. Transistor 25 turning off, also causes transistor 29 to turn on. Transistor 29 turning on begins to cause signal $W_L$ and the second terminal of capacitor 32 to rise in voltage. Prior to transistor 29 turning on, the first terminal of capacitor 32 is at a voltage of one enhancement threshold voltage below $V_{DD}$ due to transistor 28 being diode-connected. As the second terminal of capacitor 32 rises in voltage, the first terminal also rises. In this manner the first terminal is brought to a voltage significantly above one threshold voltage above $V_{DD}$. The voltage on the first terminal of capacitor 32 is coupled to the gate of transistor 29 through transistor 31 with a negligible voltage drop therethrough. With the voltage on the gate of transistor 29 well above one threshold voltage above $V_{DD}$, transistor 29 will cause only a negligible voltage drop between $V_{DD}$ and node 33, thereby driving signal $W_L$ to essentially $V_{DD}$. The only d.c. path between $V_{DD}$ and ground, when decoder circuit 10 is selected, is through transistors 26 and 30.

In the deselected state, decode portion 11 holds node 21 to ground which keeps transistor 26 turned off. With transistor 26 turned off, transistors 25 and 27 are turned on by transistor 30 operating as a load device for transistor 26. With transistor 27 turned on, node 33 is coupled to ground so that the word line will not be enabled. Transistor 25 being on keeps transistor 24 turned off but allows a d.c. path between $V_{DD}$ and ground through transistor 28, transistor 31, transistor 25, and at least one of transistors 14–20. Transistor 28 causes one enhancement threshold voltage drop while transistor 31 drops essentially the remainder of $V_{DD}$ so that transistor 29 will be off. With an address change, select signal S will cause transistor 22 to turn on with a resulting d.c. path from $V_{DD}$ to ground through transistor 22, transistor 23, and at least one of transistors 14–20. This current path is only for the duration of select signal S, however.

Signal $W_L$ can be generated without gating circuit 12 as was done previously but at substantial cost in power and speed. Without gating circuit 12, transistors 28, 31 and 25 must be made to be of sufficient gain to charge node 21 sufficiently quickly to provide signal $W_L$ in the time required. In order to achieve this, there is a resulting substantial increase in current flow in the deselected mode which is the mode for all but one decoder circuit. Gating circuit 12 provides the requisite current to node 21 to provide signal $W_L$ in the required time. Although current does flow from $V_{DD}$ through gating circuit 12 to ground in the deselected mode, this current path is eliminated after select signal S is removed. With gating circuit 12, transistors 28, 31, and 25 can be made of lower gain to substantially reduce the current through those transistors in the deselect mode. Consequently for the time that select signal S is present the current drawn is about the same with gating circuit 12, or without gating circuit 12 but including the required increased gain of transistors 28, 31, and 25. In the times between address changes, however, when select signal S is not present, there is very substantial power savings by using gating circuit 12.

Figure 2:
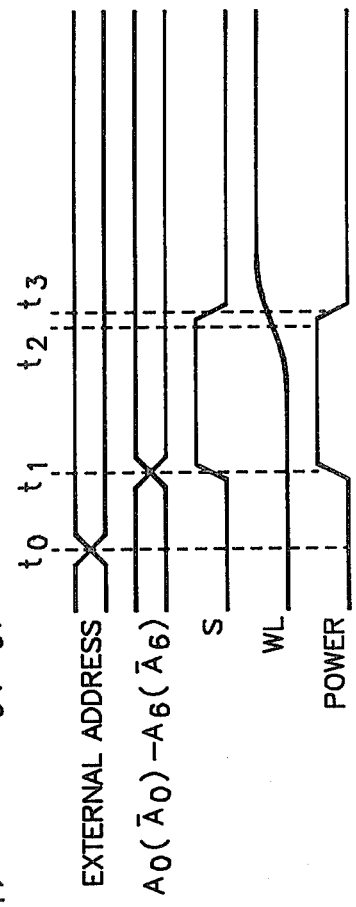
FIG. 2 is a timing diagram of some signals relevant to the circuit of FIG. 1.

Shown in FIG. 2 is the relative timing of an external address, address signals $A_o (\overline{A_o})-A_6 (\overline{A_6})$, select signal S, signal $W_L$, and power consumed by 128 decoder circuits. The external address is received at a time $t_0$ which generates the change in address signals $A_o$ ( $OVs/A/o$)–$A_6 (\overline{A_6})$, at time $t_1$ which is also the time select signal S is generated. The address is valid when the two lines are parallel. Subsequently, signal $W_L$ is generated by the selected decoder at a time $t_2$. At time $t_3$, which is shown to be very close to time $t_2$, select signal S is removed. The power consumed by all 128 decoders tracks select signal S. Previously, the power was continuously at the high level.

While the invention has been described in a preferred embodiment, it will be apparent to those skilled in the art that the disclosed invention may be modified in numerous ways and may assume many embodiments other than that specifically set out as described above. Accordingly, it is intended by the appended claims to cover all modifications of the invention which fall within the true spirit and scope of the invention.

I claim:

1. A decoder for memories for providing an enable signal in response to an address signal, comprising:

selection means coupled between a select node and a first power supply terminal for coupling the select node to the first power supply terminal when deselected by an address signal and for providing an open circuit therebetween when selected by the address signal;

a first transistor having a first current electrode coupled to a second power supply terminal, a second current electrode coupled to the select node, and control electrode for receiving a select signal;

an inverter having an input coupled to the select node, and an output;

a second transistor having a first current electrode coupled to the select node, a control electrode coupled to the output of the inverter, and a second current electrode;

a third transistor having a first current electrode coupled to the second power supply terminal, a second current electrode coupled to the select node, and a control electrode coupled to the second current electrode of the second transistor; and bootstrap means having an input coupled to the second current electrode of the second transistor for coupling the second power supply terminal to the output node with a negligible voltage drop therebetween in response to the section means being selected.

2. The decoder of claim 1 wherein the bootstrap means comprises:

a fourth transistor having a first current electrode coupled to the second power supply terminal, a control electrode coupled to the second current electrode of the second transistor, and a second current electrode for providing the enable signal;

a fifth transistor having a first current electrode and a control electrode coupled to the control electrode of the fourth transistor, and a second current electrode;

a sixth transistor having a first current electrode coupled to the second current electrode of the fifth transistor, and a second current electrode and a control electrode coupled to the second power supply terminal; and a capacitor having a first terminal coupled to the second current electrode of the fourth transistor, and a second terminal coupled to the second current electrode of the fifth transistor.

3. The decoder of claim 2 further comprising a seventh transistor having a control electrode coupled to the output of the inverter, a first current electrode coupled to the second current electrode of the fourth transistor, and a second current electrode coupled to the first power supply terminal.

4. A row decoder for memories for providing an enable signal to a word line in response to an address signal, comprising:

selection means coupled between a select node and a first power supply terminal for coupling the select node to the first power supply terminal when deselected by an address signal and for providing an open circuit therebetween when selected by the address signal; coupling means for coupling a second power supply terminal to the select node when the selection means is selected in response to receiving a select signal, wherein said select signal is generated in response to a change in the address signal; and output means for providing the enable signal in response to the coupling means coupling the second power supply terminal to the select node, and holding the enable signal at essentially the voltage present at the second power supply terminal after removal of the select signal from the coupling means.

5. The row decoder of claim 4, wherein the coupling means is an enhancement transistor having a first current electrode coupled to the second power supply terminal, a control electrode for receiving the select signal, and a second current electrode coupled to the select node.

* * * * *

UNITED STATES PATENT AND TRADEMARK OFFICE
CERTIFICATE OF CORRECTION

PATENT NO. : 4,471,240
DATED : September 11, 1984
INVENTOR(S) : David Novosel

It is certified that error appears in the above-identified patent and that said Letters Patent is hereby corrected as shown below:

In claim 1, line 12, insert -- a -- before "control".

Signed and Sealed this

Nineteenth Day of February 1985

[SEAL]

Attest:

DONALD J. QUIGG

Attesting Officer     Acting Commissioner of Patents and Trademarks